United States Patent [19]

Takeuchi

[11] Patent Number: 5,204,635

[45] Date of Patent: Apr. 20, 1993

[54] DIGITAL FM DEMODULATOR UTILIZING UNCORRELATED CLOCK REFERENCE SIGNALS

[76] Inventor: Yasuhito Takeuchi, 507-8, Yokogawacho, Hachioji, Tokyo, Japan

[21] Appl. No.: 838,738

[22] PCT Filed: Jul. 9, 1991

[86] PCT No.: PCT/JP91/00917

§ 371 Date: Mar. 11, 1992

§ 102(e) Date: Mar. 11, 1992

[87] PCT Pub. No.: WO92/01332

PCT Pub. Date: Jan. 23, 1992

[30] Foreign Application Priority Data

Jul. 9, 1990 [JP] Japan ................................ 2-181256

[51] Int. Cl.⁵ ............................................. H03D 3/02
[52] U.S. Cl. .................................... 329/336; 329/337; 375/82

[58] Field of Search ............... 329/315, 323, 327, 336, 329/337; 375/80, 82

[56] References Cited

U.S. PATENT DOCUMENTS 4,476,435 10/1984 Chang et al. ..................... 329/336

Primary Examiner—David Mis
Attorney, Agent, or Firm—Moonray Kojima

[57] ABSTRACT

An FM demodulator which generates a modulated object signal directly in digital form, wherein an input FM signal is phase detected, then converted to digital form, then quantized into a pulse density modulated binary signal using a clock reference signal having a frequency which is not correlated to the frequency of the input FM signal, and then the signal is filtered at the clock reference signal and outputted as the digital word output. Advantageously, by using the non-correlated clock reference signal, the signal to noise ratio is improved by a substantial factor.

2 Claims, 1 Drawing Sheet

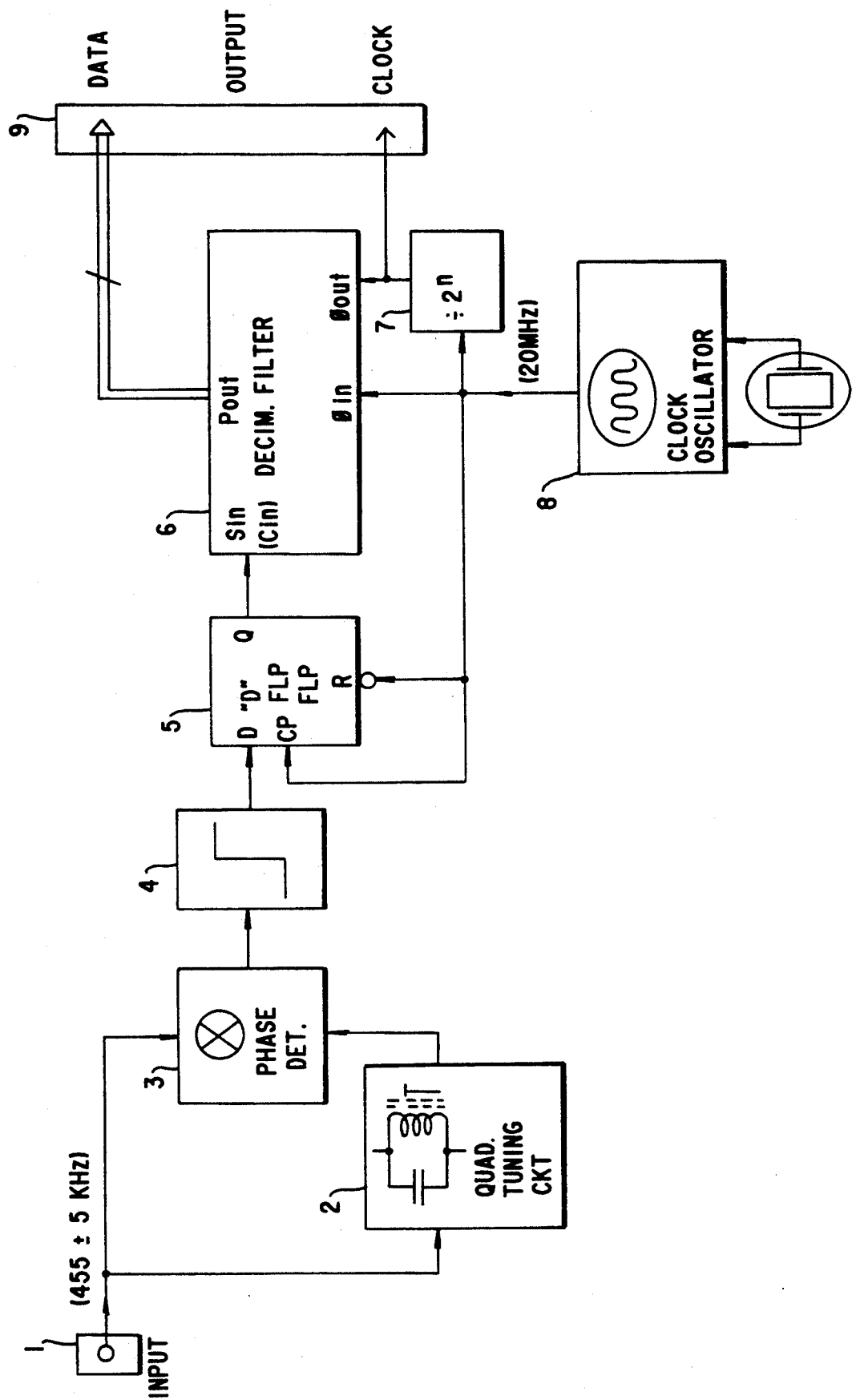

DIGITAL FM DEMODULATOR UTILIZING UNCORRELATED CLOCK REFERENCE SIGNALS

FIELD OF TECHNOLOGY

This invention relates to an FM demodulator, especially to an FM demodulator which yields the modulated object signal directly in digital word string form.

BACKGROUND OF THE TECHNOLOGY

In FM demodulating circuits which follow the final section of the IF amplifiers in radio communication equipment, etc, a standard practice is to obtain the modulated object signal in the form of an analog signal, even when the communication equipment itself actually needs it in the form of digial word string, and a demodulated analog signal is obtained after it is A/D (analog-to-digital) converted after appropriate processing as necessary.

On the other hand, there has been used a pulse-counting type FM demodulator which counts the FM carrier directly by use of a counter, over a given duration. Actually, in this case, conventional digital output can be obtained directly. However, the output of the IF amplifier still preserves the narrow band nature of the signal significantly, and the object signal appears merely in a small deviation over a fixed count number over each count duration. Also resolution and data rate can not be optimized; hence, the foregoing characteristics prevent this method from being widely used.

Another method is known as the period or duration measuring method; however, due to the same reasons as above stated, this method cannot be widely used.

In order to be adequate and/or suitable, for such counter type FM demodulator circuit, the IF signal to be counted must have a very wide deviation, such as, the modulation index should exceed several percents. This can be realized only by again converting the IF signal down to a still lower frequency, which only amplifies the complexity of the total circuit of the receiver.

DISCLOSURE OF THE INVENTION

This invention aims to solve the redundancy and/or difficulty of the above mentioned methods. A frequency dependent phase difference generating circuit is followed by a phase comparator circuit. Instead of producing the demodulated output in an analog signal, as in the prior art, by means of averaging the binary output of the phase comparator, in the invention, the binary output is quantized in time domain by predetermined fixed rate clock signals, without averaging at all. The resultant time domain quantized binary signal in pulse density modulation form is converted to a signal in a parallel digital word string form by a counter or a decimation filter, to obtain an object signal directly in a digital word string form. The advantages of the direct digital demodulator are the reduction of parts and cost by virtue of the reduction of processing steps, the reduction fo saize, nd enabcement reduction of processing steps, the reduction of size, and enhancement of reliability. Furthermore, non-linearity distortion, offset, gain variation, noise contamination, all of which arises from analog parts and circuits can be avoided, because, in the invention, the object signal is not passed at all through any analog stages.

EXPLANATION OF THE FIGURE

The sole FIGURE is an exemplary block diagram of a preferred embodiment of the invention. The members are given below.

(1) . . . input terminal.
(2) . . . Quadrature tank circuit, or any frequency dependent phase difference generating circuit.
(3) . . . phase comparator, or 4-quadrant multiplier.
(4) . . . digitizer.
(5) . . . D-type flip-flop.
(6) . . . counter or decimation filter.
(7) . . . frequency divider.
(8) . . . clock generator.
(9) . . . output port.

EXPLANATION OF A PREFERRED EMBODIMENT

The embodiment essentially is an FM demodulator comprising a frequency-dependent phase difference generating means, such as a quadrature tank circuit, delay line, injection lock oscillator, phase lock loop (PLL), etc, to which the input FM signal to be demodulated is supplied;

a phase comparator means which compares the phases of the signals, one passing through the frequency dependent phase difference generating means and the other coming directly; means for generating a binary, unaveraged, pulse width modulated signal from the output of the phase comparator means;

a time domain quantization means for generating a pulse density modulated binary signal by means of clocking the pulse width modulated signal by use of a reference clock signal; and a counter or decimation filter means for counting or low pass filtering the clocked pulse density modulated binary signal, and characterized such that the counter or decimation filter yields, at its output, the object signal modulated on and carried by the input FM signal, in the form of a digital word string.

Hereafter, a preferred embodiment will be explained in detail with reference to the sole FIGURE. However, it is to be understood that this is merely an example, and that there will be a variety of different embodiments within the spirit and scope of the invention, which will be apparent to the persons who are knowledgeable, experienced and/or in the practice of the same or similar businesses. The invention, however, is not to be considered to be restricted to the embodiment hereafter disclosed.

In the sole FIGURE of the drawing, the input terminal 1 accepts an FM signal to be demodulated, where the leading circuit to the terminal 1 is an ordinary limiting IF amplifier which gives an amplitude limited almost binary signal, whose specified frequency is 455 KHz±5 KHz, or the like. This signal is distributed to two paths, one directly to one of the two inputs of the phase comparator 3 and the other indirectly to the other input terminal of phase comparator 3, that is via quadrature tank circuit 2. Hence, the two signals at the input terminals of the phase comparator 3 always have a phase difference generated by quadrature tank circuit 2.

The instantaneous output of the phase comparator 3 is a binary signal whose sign is a product of the signs of the two input signals. As a result, this binary signal makes a pulse width modulated, or in other words, pulse duty factor modulated signal, where its width or duty factor is closely related to the instantaneous frequency of the the subject signal to be demodulated. For this task, the phase comparator may be either a four quadrant multiplier or an exclusive OR gate, or an AND gate, or D-type flip-flop, with suitable circuit arrangements. In FM demodulating circuits, such circuitry use commonly known methods of operation. The quadrature tank circuit can be replaced with a delay line, injection lock oscillator, phase lock loop (PLL), etc., or any frequency dependent phase difference generating circuit.

In the conventional FM demodulator where an analog output is at first given, the binary output of the phase comparator is averaged by a low pass filter to make the signal proportional to the duty factor of the binary output signal.

On the other hand, in the present invention, such an analog averaging is not performed at all; rather, the binary output signal is considered as a pulse density modulated signal, and thereafter all the necessary processing is done digitally.

The box 4 in the figure is a threshold circuit or a binaryizer where the output signal of the phase comparator 3 is refined to be more completely in the binary form. However, this is not mandatory, for example, if the phase comparator 3 operates in a completely binary form. The following box 5 is a D-type flip flop which quantizes, in a time domain, the above refined binary signal, by means of a clock signal supplied by an independent clock generator 8. The Q output of D flip-flop 5 takes on logic 1 when the refined binary signal is 1 at the moment of the rising edge of the clock, and retains the 1 while the clock remains 1 during its positive half cycle, then the reference binary signal falls to 0 when the clock falls down to 0 during its negative half cycle. However, if the refined binary signal is 0 at the moment of the rising edge of the clock, it remains 0 until the next cycle of the clock.

The frequency of the clock signal is selected to be very high as compared to the frequency of the subject signal to be demodulated given at terminal 1. For example, if a 455 KHz signal is to be demodulated, the clock signal may be as high as 10 to 20 MHz, or even higher but within the operative range of the logic components used herein. Due to such time domain quantization, the output of the D flip-flip could be considered as a clocked pulse density modulated signal.

The following box 6 is a counter or decimation filter. When a counter is used, counter 6 counts the clocked pulse density modulated signal for a given time period. When a decimation filter is used, the decimation filter 6 performs a digital low-pass operation over the pulse train of the clocked pulse density modulated signal, where every clocked pulse is treated as a digital word in the form of one bit per one word. For example, the counting method may be such that an 8-bit length signal word will be obtained for each counting period which could be determined by a frequency divider 7 counting the clock of 1/256, or 1 by 2's to the 8th power. This signal word represents an average pulse density over such counting period, and hence, it represents the instantaneous value of the modulating signal modulated on the input signal to be demodulated. Although a forced quantization in the time domain is performed at the stage of the output of the phase comparator 3, the quantization noise is practically negligible due to averaging of its probability of occurence over the counting period.

When a decimation filter is used, the suppression of the quantization noise is more perfect, or it can have better amplitude resolution for a much higher data rate. The reset operation of D-type flip-flop 5 at each negative half cycle of the clock is not necessary if the decimation filter input circuit itself has a clocked input structure where a suitable circuit and timing arrangement will still allow the D-type flip-flop 5 itself to be not necessary. The decimation filter for this purpose can be a similar one used for post processing in a delta-sigma type A/D converter, i.e., the filter can be a transveral filter, whose input is a series of high frequency clocked one bit per one word data, and whose output is a suitably lower frequency clocked signal word string, and whose tap coeffcents have suitable gradations. It yields a weighted probability density of input logic levels over a given time period, which means the instantaneous value of the modulating signal modulated on the input signal to be demodulated.

On the other hand, when a counter is used, it could also be considered as a type of decimation filter where all of the coefficients are is "one", so as to form a simple averager over the given counting period.

In a suitable manner, there is obtained a time series of parallel digital word representing instantaneous value of the modulating signal modulated on the input signal. This eliminates the necessity of any further A/D conversion, such as necessary in conventional analog demodulating, in order to couple the demodulator to a digital handling system, not shown hereat.

Advantageously, the major components shown in the figure, except the quadrature tank circuit, can be integrated into a plain CMOS monolithic integrated circuit. Furthermore, the limiting IF amplifier to lead the circuit also can be integrated into the chip.

As discussed, the invention allows the realization of a circuit arrangement wherein no intermediate analog section appears in terms of the subject signal, for communication receivers or FM radios, where the subject signal is handled digitally throughout. This contributes greatly to making more precise the system transfer function, elimination of drift, offset and/or distortion, reduction of the number of parts, simplification of circuitry, reduction of size and of power consumption, and to increase reliability, and to realize a highly integrated design. Although in the above embodiment a signal of 455 KHz±, and a clock signal of 10 to 20 MHz were used, such an arrangement is desired, but not essential. The operation of the invention requires only that the input signal and the clock signal have no mutual correlation. The large difference in frequency shown for the embodiment meets this requirement. Only when such uncorrelated clock is used, could the pulse width modulated signal at the output of the phase comparator be translated to a clocked pulse density modulated signal. In other words, their correlation, i.e. their mutual beat must of of a sufficiently high frequency, or off from the subject signal frequency in order to be able to be easily rejected by the decimation filter, including the case of the counter.

Although a preferred embodiment of the invention has been disclosed, it will be apparent to those knowledgeable, experienced and/or practitioner of the subject field of business, that there is a variety of deviations from the embodiment of the invention within the hereafter sole claim.

I claim:

1. An FM demodulator comprising means for receiving an input FM signal to be demodulated and for generating a first signal of a first phase;

phase comparator means for comparing the phases of said first signal and said input FM signal, and for generating a second signal;

means for receiving said second signal and for providing from said second signal, a binary, unaveraged, pulse width modulated digital signal;

oscillator means for generating a reference clock signal of a predetermined frequency having no correlation to the frequency of said input FM signal;

time domain quantization means for producing a digital clocked pulse density modulated binary signal by clocking said pulse width modulated digital signal with said reference clock signal; and means for filtering said digital clocked pulse density modulated binary signal, and for generating an output signal modulated on and carried by said input FM signal in the form of a digital word chain.

2. The demodulator of claim 1, wherein said input FM signal is at a first frequency, and the reference clock signal is at a second frequency which is between 100 to 200 times higher than the first frequency.

* * * * *